United States Patent
Sano

(10) Patent No.: US 9,366,730 B2
(45) Date of Patent: Jun. 14, 2016

(54) BATTERY VOLTAGE DETECTOR CIRCUIT

(71) Applicant: Seiko Instruments Inc., Chiba-shi, Chiba (JP)

(72) Inventor: Kazuaki Sano, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 86 days.

(21) Appl. No.: 14/179,975

(22) Filed: Feb. 13, 2014

(65) Prior Publication Data

US 2014/0232412 A1    Aug. 21, 2014

(30) Foreign Application Priority Data

Feb. 15, 2013   (JP) .................................. 2013-028212

(51) Int. Cl.
| | |
|---|---|
| *H02J 7/00* | (2006.01) |
| *H02J 7/14* | (2006.01) |
| *G01R 31/36* | (2006.01) |
| *G01R 19/165* | (2006.01) |
| *G01R 19/00* | (2006.01) |
| *G01R 19/10* | (2006.01) |

(52) U.S. Cl.
CPC .......... *G01R 31/3658* (2013.01); *G01R 31/362* (2013.01); *G01R 19/0084* (2013.01); *G01R 19/10* (2013.01); *G01R 19/16542* (2013.01); *H02J 7/0021* (2013.01)

(58) Field of Classification Search
USPC ......... 324/434, 426, 425, 427, 428, 429, 430, 324/431, 432, 433; 320/116, 166, 118, 119, 320/128, 132
See application file for complete search history.

(56) References Cited

U.S. PATENT DOCUMENTS

| | | | | |
|---|---|---|---|---|
| 6,570,387 | B2 * | 5/2003 | Maki et al. ..................... | 324/434 |
| 7,564,217 | B2 * | 7/2009 | Tanigawa et al. ............. | 320/118 |
| 7,592,774 | B2 * | 9/2009 | Morimoto ..................... | 320/116 |
| 8,493,036 | B2 * | 7/2013 | Ferrario ........................ | 320/166 |
| 8,692,556 | B2 * | 4/2014 | Makihara ....................... | 324/426 |
| 2001/0019269 | A1 | 9/2001 | Yudahira | |
| 2004/0051534 | A1* | 3/2004 | Kobayashi et al. ........... | 324/429 |
| 2005/0189949 | A1* | 9/2005 | Shimizu et al. ............... | 324/434 |
| 2006/0071643 | A1 | 4/2006 | Carrier et al. | |
| 2010/0073004 | A1* | 3/2010 | Miyamoto .................... | 324/426 |
| 2010/0134115 | A1* | 6/2010 | Ohnuki ............... | B60L 11/1861 324/429 |
| 2013/0015821 | A1* | 1/2013 | Kim ...................... | H02J 7/0019 320/128 |
| 2013/0057294 | A1* | 3/2013 | Mizoguchi et al. ........... | 324/434 |
| 2013/0285667 | A1* | 10/2013 | Koduka et al. ................ | 324/433 |
| 2014/0043032 | A1* | 2/2014 | Makino et al. ................ | 324/434 |

* cited by examiner

*Primary Examiner* — Alexis A Boateng
(74) *Attorney, Agent, or Firm* — Brinks Gilson & Lione

(57) ABSTRACT

There is provided a battery voltage detector circuit which uses a multiplexer system and which is capable of reducing the influence of the deviation of a detected voltage attributable to a parasitic capacitance, thus improving the accuracy of voltage detection. The battery voltage detector circuit that monitors the voltages of a plurality of batteries connected in series includes a flying capacitor, a multiplexer switch that sequentially connects the flying capacitor to the plurality of batteries, a voltage detecting unit that detects the voltage of the flying capacitor, a first reference potential detecting unit connected to one terminal of the flying capacitor, a second reference potential connecting unit connected to the other terminal of the flying capacitor, and a control circuit that controls the multiplexer switch, the first reference potential connecting unit and the second reference potential connecting unit.

3 Claims, 3 Drawing Sheets

BATTERY VOLTAGE DETECTOR CIRCUIT

RELATED APPLICATIONS

This application claims priority under 35 U.S.C. §119 to Japanese Patent Application No. 2013-028212 filed on Feb. 15, 2013, the entire content of which is hereby incorporated by reference.

BACKGROUND OF THE INVENTION

1. Field of the Invention

The present invention relates to a protection circuit of a secondary battery, such as a lithium battery, and more particularly to a battery voltage detector circuit of a protection circuit that uses a multiplexer.

2. Background Art

In general, a secondary battery, such as a lithium battery, uses a protection circuit to protect the battery from overcharge or overdischarge. A protection circuit has a voltage detecting unit for detecting the voltage of a battery. Protecting a plurality of batteries connected in series requires a plurality of voltage detecting units corresponding to the individual batteries, thus leading to a larger scale and a higher withstand voltage of the circuit.

FIG. 2 is a circuit diagram of a battery voltage detector circuit that uses a conventional multiplexer. The battery voltage detector circuit using the conventional multiplexer includes a battery power supply device 11, a battery 11a, switches 21, 22, 23 and 24, flying capacitors 28 and 29, an amplifier 25, an A/D converter 26, and a controller 30. The switch 21 is composed of normally open contacts 21a and 21b, the switch 23 is composed of normally open contacts 23a and 23b, and the switch 24 is composed of normally open contacts 24a and 24b.

To detect the voltage of the battery 11a, the switches 21 to 24 are set to an OFF (open) state. In this state, the switch 21 is first set to an ON state and the normally open contacts 21a and 21b are individually set to a closed state. This causes the voltage in the battery 11a to be applied to the flying capacitors 28 and 29, which are connected in series. Thus, electric charges are accumulated in the flying capacitors 28 and 29.

After the switch 21 is held in an ON position for a predetermined period of time, the switch 21 is set to the OFF state and the normally open contacts 21a and 21b are individually set to the open state. This causes the electric charges corresponding to the voltage of the battery 11a to be accumulated in the flying capacitors 28 and 29.

Thereafter, the switch 22 and the switch 24 are turned on. Turning the switch 22 on causes the connection point of the flying capacitors 28 and 29 to be connected to the ground and fixed to 0V. When the switch 24 is turned on and the normally open contacts 24a and 24b are individually set to the closed state, an inverting input terminal of the amplifier 25 is fixed to the same potential (0V) of an output of the amplifier 25, and the voltage of a non-inverting input terminal is fixed to the ground (0V).

Thereafter, the switch 23 is turned on and the normally open contacts 23a and 23b are individually set to the closed state. This causes the flying capacitors 28 and 29 to be connected to the inverting input terminal and the non-inverting input terminal, respectively, of the amplifier 25. However, the switch 24 is on, so that the voltages of the terminals are fixed and the voltages of the flying capacitors 28 and 29 are not applied to the terminals of the amplifier 25.

Thereafter, the switch 24 is turned off and the fixation of the voltages at the terminals of the amplifier 25 are cleared, thereby causing the voltages accumulated in the flying capacitors 28 and 29 to be applied to the amplifier 25. The voltages of the flying capacitors 28 and 29 are applied in the state wherein the voltages of the input terminals of the amplifier 25 are fixed to 0V. This makes it possible to accurately detect the voltages applied from the flying capacitors 28 and 29 without the risk of the voltages of the input terminals exceeding a permissible range or an output of the amplifier 25 being saturated. In addition, the voltages supplied to the amplifier 25 are unlikely to exceed a permissible range, thus protecting the amplifier 25 from deterioration and damage (refer to, for example, Patent Document 1).

[Patent Document 1] Japanese Patent Application Laid-Open No. 2001-201548

However, the conventional art has been posing a problem in that, at the instant the switch 22 is turned on, electric charges move to a parasitic capacitance produced between the switch 22 and the flying capacitors 28 and 29 and the holding voltages of the flying capacitors 28 and 29 change, leading to deteriorated voltage detection accuracy.

SUMMARY OF THE INVENTION

The present invention has been made with a view toward solving the problem described above and an object of the invention is to achieve improved voltage detection accuracy by reducing the influence of a detected voltage deviation attributable to a parasitic capacitance in a battery voltage detector circuit that uses a multiplexer system.

To solve the problem with the prior art, a battery voltage detector circuit in accordance with the present invention is configured as described below.

The battery voltage detector circuit is adapted to monitor the voltages of a plurality of batteries connected in series, and includes: a flying capacitor; a multiplexer switch that sequentially connects the flying capacitor to a plurality of batteries; a voltage detecting unit that detects the voltage of the flying capacitor; a first reference potential connecting unit connected to one terminal of the flying capacitor; a second reference potential connecting unit connected to the other terminal of the flying capacitor; and a control circuit that controls the multiplexer switch, the first reference potential connecting unit, and the second reference potential connecting unit.

The battery voltage detector circuit in accordance with the present invention is capable of reducing the influence of a parasitic capacitance on the detection of a battery voltage thereby to improve the accuracy of voltage detection.

DETAILED DESCRIPTION OF THE PREFERRED EMBODIMENTS

The following will describe embodiments of the present invention with reference to the accompanying drawings.

[First Embodiment]

Figure 1:
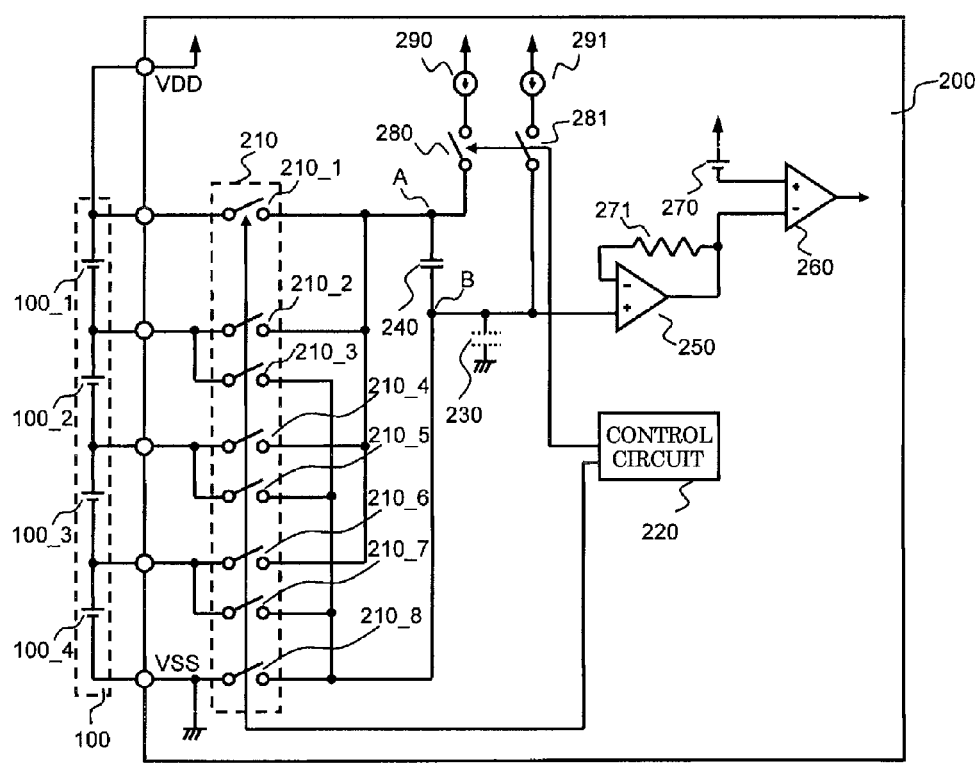
FIG. 1 is a circuit diagram illustrating a battery voltage detector circuit according to a first embodiment.

FIG. 1 is a circuit diagram of a battery voltage detector circuit according to a first embodiment. The battery voltage detector circuit according to the present embodiment is constituted of a row of batteries 100 and a battery voltage detector circuit 200. The row of batteries 100 is formed of batteries 100_1, 100_2, 100_3, and 100_4. The battery voltage detector circuit 200 is constituted of a multiplexer switch 210, a flying capacitor 240, switches 280 and 281, constant current circuits 290 and 291, an amplifier 250, a comparator 260, a reference voltage circuit 270, a control circuit 220, a resistor 271, a VDD terminal, and a VSS terminal. The multiplexer switch 210 is constituted of switches 210_1, 210_2, 210_3, 210_4, 210_5, 210_6, 210_7, and 210_8. One end of the flying capacitor 240 is denoted as a node A, while the other end thereof is denoted as a node B.

The positive electrode of the battery 100_1 is connected to the VDD terminal and one terminal of the switch 210_1, while the negative electrode thereof is connected to the positive electrode of the battery 100_2 and one terminal of each of the switch 210_2 and the switch 210_3. The other terminal of each of the switch 210_1 and the switch 210_2 is connected to the node A, while the other terminal of the switch 210_3 is connected to the node B. The positive electrode of the battery 100_3 is connected to the negative electrode of the battery 100_2 and one terminal of each of the switch 210_4 and the switch 210_5, while the negative electrode thereof is connected to the positive electrode of the battery 100_4 and one terminal of each of the switch 210_6 and the switch 210_7. The other terminal of each of the switch 210_4 and the switch 210_6 is connected to the node A, and the other terminal of each of the switch 210_5 and the switch 210_7 is connected to the node B.

One terminal of the switch 210_8 is connected to the VSS terminal and the negative electrode of the battery 100_4, while the other terminal is connected to the node B. One terminal of the switch 280 is connected to the constant current circuit 290, while the other terminal thereof is connected to the node A. The other terminal of the constant current circuit 290 is connected to the VDD terminal. One terminal of the switch 281 is connected to the constant current circuit 291, while the other terminal thereof is connected to the node B. The other terminal of the constant current circuit 291 is connected to the VDD terminal. An inverting input terminal of the amplifier 250 is connected to one terminal of the resistor 271, while the non-inverting input terminal thereof is connected to the node B, while the output thereof is connected to the other terminal of the resistor 271 and the inverting input terminal of the comparator 260. The non-inverting input terminal of the comparator 260 is connected to the negative electrode of the reference voltage circuit 270, while the positive electrode of the reference voltage circuit 270 is connected to the VDD terminal. The amplifier 250, the comparator 260, the reference voltage circuit 270, and the resistor 271 constitute a voltage detecting unit. The switches 280 and 281 and the multiplexer switch 210 are controlled to be turned on/off by the control circuit 220. A parasitic capacitance 230 exists on the node B.

The operation of the battery voltage detector circuit will be described. The flying capacitor 240 is controlled by a signal of the control circuit 220 such that the flying capacitor 240 becomes parallel to one of the row of batteries 100. The signal of the control circuit 220 causes the switch 210_1 and the switch 210_3 to turn on and the remaining switches to turn off, thus connecting the battery 100_1 and the flying capacitor 240. The flying capacitor 240 is charged to the same voltage (V0) as that of the battery 100_1. Thereafter, the signal of the control circuit 220 causes the switch 210_1 and the switch 210_3 to turn off, thus disconnecting the battery 100_1 and the flying capacitor 240.

Then, when the switch 280 is turned on by the signal of the control circuit 220, the node A is pulled up by the constant current circuit 290 to the voltage of the VDD terminal (VDD). The voltage of the node B becomes VDD−V0, and the voltage of VDD−V0 is applied to the non-inverting input terminal of the amplifier 250. The voltage of VDD−V0 is supplied to the output of the amplifier 250, so that the voltage of the reference voltage circuit 270 (comparison voltage) and the voltage of VDD−V0 are compared by the comparator 260, thus making it possible to detect whether the voltage of the flying capacitor 240 is higher or lower than the comparison voltage. In other words, it is possible to detect whether the voltage of the battery 100_1 is higher or lower than the comparison voltage by comparing the voltage of the battery 100_1 with the comparison voltage. The voltages of all the batteries can be monitored by carrying out the foregoing series of operations also on the remaining batteries.

The case where the parasitic capacitance 230 exists on the node B will be discussed. All the batteries of the row of batteries 100 are assumed to have V0, and the flying capacitor 240 is connected to the battery 100_4 at the lowermost end. At this time, the voltage of the node B is VSS, and the voltage of the parasitic capacitance 230 becomes 0V. All the switches of the multiplexer switch 210 are turned off to open the flying capacitor 240, and then the switch 280 is turned on. This causes the node A to be pulled up by the constant current circuit 290. The parasitic capacitance 230 is charged by the constant current circuit 290. The charging current flows via the flying capacitor 240, so that the holding voltage of the flying capacitor 240 becomes higher than V0. The voltage of the flying capacitor 240 when the voltage of the node A eventually becomes equivalent to VDD will be represented by the following expression.

$$V0+Cx/(C+Cx) \times 3V0$$

where C denotes the capacitance value of the flying capacitor 240, and Cx denotes the capacitance value of the parasitic capacitance 230. The deviation width of the voltage of the flying capacitor 240 is denoted by $Cx/(C+Cx) \times 3V0$ of the second term. In this case, $Cx/(C+Cx)$ denotes the capacitance ratio between the flying capacitor 240 and the parasitic capacitance 230, and $3V0$ denotes the voltage deviation width observed from a state, in which the node A is connected to the battery 100 at the lowermost end, to the moment when the node A is pulled up to VDD.

Thus, it is understood that the larger the capacitance value of the parasitic capacitance 230 as compared with the capacitance value of the flying capacitor 240, the larger the deviation amount becomes. The deviation amount also increases as the voltage of a battery to be monitored is farther from a reference potential.

A case where a battery voltage monitoring circuit is integrated on an IC is assumed. It is also assumed that the capacitance value of the flying capacitor 240 is 10 pF and the capacitance value of the parasitic capacitance 230 is 100 fF. It is further assumed that the battery voltages are all 4.0 V and that the batteries are connected in 4 series, as illustrated in FIG. 1. The amount of deviation that occurs when detecting the voltage of the battery at the lowermost end will be as follows:

$$100fF/(100pF+100fF) \times 3 \times 4.0 = 12 \, mV$$

The overcharge detection voltage of a general lithium battery is required to have an accuracy of approximately ±20 mV. This means that the foregoing amount of deviation will have a significant adverse effect on the accurate performance of the battery voltage detector circuit.

In order to reduce the influence of the parasitic capacitance 230, all the switches of the multiplexer switch 210 are turned off to open the flying capacitor 240 and then the switches 280 and 281 are simultaneously turned on. This enables not only the constant current circuit 290 but also the constant current circuit 291 to contribute to the charging of the parasitic capacitance 230. Control is carried out such that, when the potential of the node A reaches VDD, the switch 281 is turned off by the control circuit 220. This prevents the constant current circuit 291 from charging the flying capacitor 240, so that a voltage deviation of the flying capacitor 240 will not occur.

The deviation taking place in the flying capacitor 240 decreases as the parasitic capacitance 230 is charged more by the constant current circuit 291 than by the constant current circuit 290 by the time when the node A reaches VDD. Therefore, in order to increase the voltage detection accuracy, the amount of current of the constant current circuit 291 is desirably larger than that of the constant current circuit 290. If the current values of the constant current circuits 290 and 291 are the same, then the deviation width of the voltage of the flying capacitor 240 will be $Cx/(2C+Cx) \times 3V0$, making it possible to obtain equivalently the same effect that would be obtained by increasing the capacitance value of the flying capacitor 240.

In the above description, the amplifier 250 has been used to detect the voltage of the flying capacitor 240. However, the amplifier may not necessarily be used as long as the configuration is capable of detecting the voltage of the flying capacitor 240.

Further, in the above description, the constant current circuits 290 and 291 have been used to pull up the flying capacitor 240 and to charge the parasitic capacitance 230. However, the constant current circuits may not necessarily be used, and direct connection to the resistor or VDD or a different configuration may be used as long as the configuration is capable of pulling up the flying capacitor 240 and charging the parasitic capacitance 230.

Thus, the battery voltage detector circuit according to the first embodiment is capable of improving the voltage detection accuracy by charging the parasitic capacitance 230 by using the constant current circuit 291. Further, the improved accuracy can be achieved without increasing the size of the flying capacitor 240, so that the layout area can be reduced accordingly.

[Second Embodiment]

Figure 2:
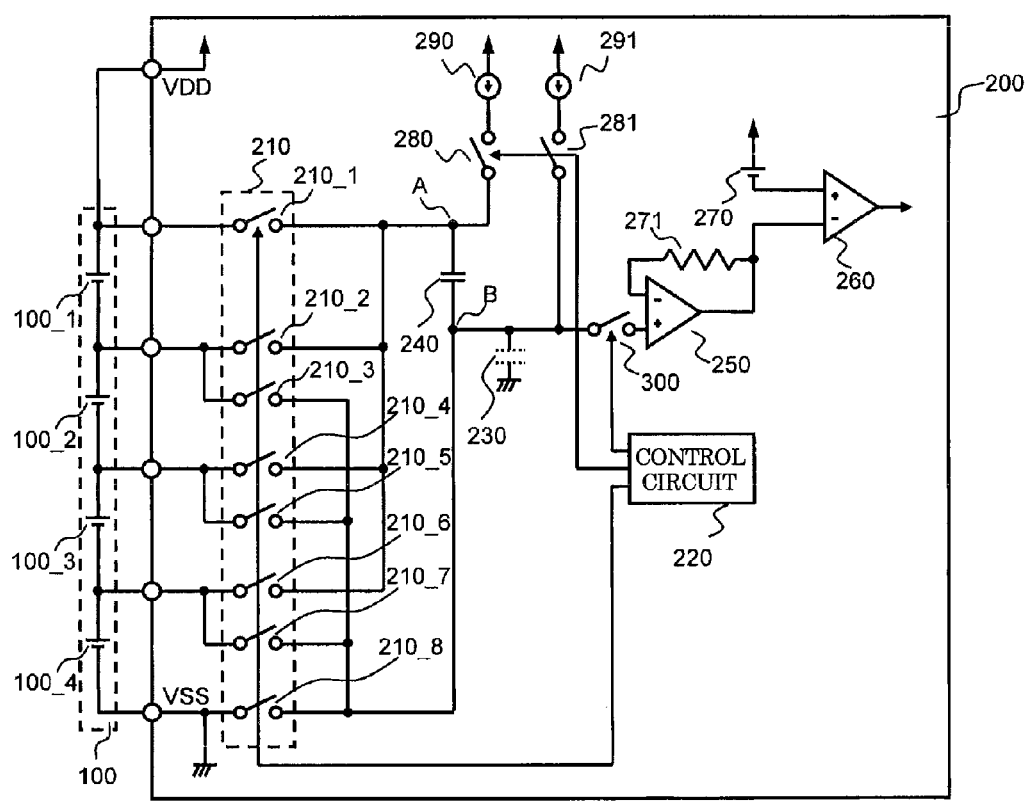
FIG. 2 is a circuit diagram illustrating a battery voltage detector circuit according to a second embodiment.
Figure 3:
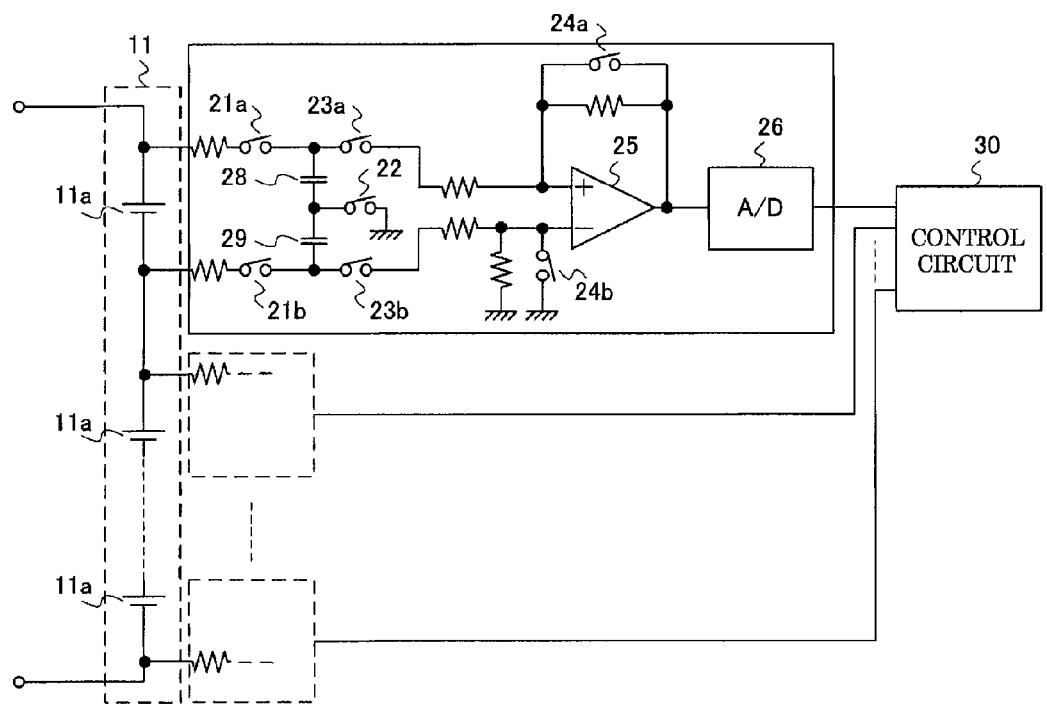
FIG. 3 is a circuit diagram illustrating a conventional battery voltage detector circuit.

FIG. 2 is a circuit diagram of a battery voltage detector circuit according to a second embodiment, which differs from the one illustrated in FIG. 1 in that a switch 300 has been added. Regarding the connection, one terminal of the switch 300 is connected to the connection point of a switch 281 and a flying capacitor 240, while the other terminal thereof is connected to a non-inverting input terminal of the amplifier 250. The switch 300 is controlled to be turned on/off by a control circuit 220.

The operation the battery voltage detector circuit will be described. The flying capacitor 240 is controlled by a signal of the control circuit 220 such that the flying capacitor 240 becomes parallel to one of a row of batteries 100. The signal of the control circuit 220 causes a switch 210_1 and a switch 210_3 to turn on and the remaining switches to turn off, thus connecting the battery 100_1 and the flying capacitor 240. The flying capacitor 240 is charged to the same voltage (V0) as that of the battery 100_1. Thereafter, the signal of the control circuit 220 causes the switch 210_1 and the switch 210_3 to turn off, thus disconnecting the battery 100_1 and the flying capacitor 240.

Then, when a switch 280 is turned on by the signal of the control circuit 220, a node A is pulled up by a constant current circuit 290 to the voltage of a VDD terminal (VDD). The voltage of a node B becomes VDD−V0, and the voltage of VDD−V0 is applied to the non-inverting input terminal of the amplifier 250 when the switch 300 is turned on by a signal of the control circuit 220. The voltage of VDD−V0 is supplied to the output of the amplifier 250, so that the voltage of a reference voltage circuit 270 (comparison voltage) and the voltage of VDD−V0 are compared by a comparator 260, thus making it possible to detect whether the voltage of the flying capacitor 240 is higher or lower than the comparison voltage. In other words, the voltage of the battery 100_1 can be compared with the comparison voltage to detect whether the voltage of the battery 100_1 is higher or lower than the comparison voltage. The voltages of all the batteries can be monitored by carrying out the series of operations described above also on the remaining batteries.

The case where a parasitic capacitance 230 exists on a node B will be discussed. All the batteries of the row of batteries 100 are assumed to have V0, and the flying capacitor 240 is connected to the battery 100_4 at the lowermost end. At this time, the voltage of the node B is VSS, and the voltage of a parasitic capacitance 230 becomes 0V. All the switches of a multiplexer switch 210 are turned off to open the flying capacitor 240, and then the switch 280 is turned on. This causes the node A to be pulled up by a constant current circuit 290. The parasitic capacitance 230 is charged by the constant current circuit 290. The charging current flows via the flying capacitor 240, so that the holding voltage of the flying capacitor 240 becomes higher than V0. The voltage of the flying capacitor 240 when the voltage of the node A eventually becomes equivalent to VDD is represented by the following expression.

$$V0 + Cx/(C+Cx) \times 3V0$$

where C denotes the capacitance value of the flying capacitor 240, and Cx denotes the capacitance value of the parasitic capacitance 230. The deviation width of the voltage of the flying capacitor 240 is expressed by $Cx/(C+Cx) \times 3V0$ of the second term. In this case, $Cx/(C+Cx)$ denotes the capacitance ratio between the flying capacitor 240 and the parasitic capacitance 230, and 3V0 denotes the width of voltage shift that occurs from a state, in which the node A is connected to the battery 100 at the lowermost end, to the moment when the node A is pulled up to VDD.

Thus, it is understood that the deviation amount increases as the capacitance value of the parasitic capacitance 230 is larger than the capacitance value of the flying capacitor 240. The deviation amount also increases as the voltage of a battery to be monitored is farther from a reference potential.

It is assumed that a battery voltage monitoring circuit is integrated on an IC, and the capacitance value of the flying capacitor 240 is 10 pF and the capacitance value of the parasitic capacitance 230 is 100 fF. It is further assumed that the battery voltages are all 4.0 V and that the batteries are connected in 4 series, as illustrated in FIG. 1. The amount of deviation that occurs when detecting the voltage of the battery at the lowermost end will be as follows:

$$100fF/(100pF+100fF) \times 3 \times 4.0 = 12\ mV$$

The overcharge detection voltage of a general lithium battery is required to have an accuracy of approximately ±20 mV. This means that the foregoing amount of deviation will have a significant adverse effect on the accurate performance of the battery voltage detector circuit.

In order to reduce the influence of the parasitic capacitance 230, all the switches of the multiplexer switch 210 and the switch 300 are turned off to open the flying capacitor 240 and then the switches 280 and 281 are simultaneously turned on. This enables not only the constant current circuit 290 but also the constant current circuit 291 to charge the parasitic capacitance 230. The constant current circuit 291 will not charge the flying capacitor 240, so that a voltage deviation of the flying capacitor 240 will not occur. The switch 281 is turned off by the control circuit 220 when or before the node A reaches VDD.

The deviation taking place in the flying capacitor 240 decreases as the parasitic capacitance 230 is charged more by the constant current circuit 291 than by the constant current circuit 290 by the time the node A reaches VDD. Therefore, in order to increase the voltage detection accuracy, the amount of current of the constant current circuit 291 is desirably larger than that of the constant current circuit 290. If the current values of the constant current circuits 290 and 291 are the same, then the deviation width of the voltage of the flying capacitor 240 will be $Cx/(2C+Cx) \times 3V0$, making it possible to obtain equivalently the same effect that would be obtained by increasing the capacitance value of the flying capacitor 240.

Turning the switch 300 off while the flying capacitor 240 is being pulled up makes it possible to eliminate the influences of the parasitic capacitance existing from the switch 281 to the input terminal of the amplifier 250 and the gate capacitance of an input transistor of the amplifier 250. Thus, using the switch 300 permits a reduced influence of the parasitic capacitance 230, resulting in improved voltage detection accuracy.

In the above description, the amplifier 250 has been used to detect the voltage of the flying capacitor 240. However, the amplifier may not necessarily be used and a different configuration may be used as long as the configuration is capable of detecting the voltage of the flying capacitor 240.

Further, in the above description, the constant current circuits 290 and 291 have been used to pull up the flying capacitor 240 and to charge the parasitic capacitance 230. However, the constant current circuits may not necessarily be used, and direct connection to or connection through the resistor to VDD may be implemented, or a different configuration may be used as long as the configuration is capable of pulling up the flying capacitor 240 and charging the parasitic capacitance 230.

Thus, the battery voltage detector circuit according to the present embodiment is capable of improving the voltage detection accuracy by charging the parasitic capacitance 230 by using the constant current circuit 291. The improved accuracy can be achieved without increasing the size of the flying capacitor 240, so that the layout area can be reduced accordingly. Further, the influences of the parasitic capacitances of the amplifier and the like and the gate capacitance can be removed, thus permitting further improved voltage detection accuracy.

What is claimed is:

1. A battery voltage detector circuit adapted to monitor the voltages of a plurality of batteries connected in series, comprising:
   a flying capacitor;
   a multiplexer switch that sequentially connects the flying capacitor to the plurality of batteries;
   a voltage detecting unit that detects the voltage of the flying capacitor;
   a first reference potential connecting unit connected to one terminal of the flying capacitor configured to generate a first current flow towards the one terminal;
   a second reference potential connecting unit connected to the other terminal of the flying capacitor configured to generate a second current flow towards the other terminal; and
   a control circuit that controls the multiplexer switch, the first reference potential connecting unit, and the second reference potential connecting unit, wherein the control circuit controls the first and second reference potentials to generate the first and second current flows towards the first and second terminal simultaneously during a portion of a voltage monitoring period.

2. The battery voltage detector circuit according to claim 1, wherein the control circuit carries out control to turn off the multiplexer switch and then to turn on the first reference potential connecting unit and the second reference potential connecting unit, and
   to turn off the second reference potential connecting unit when a terminal potential of the flying capacitor to which the first reference potential connecting unit is connected reaches the same potential as a reference potential.

3. The battery voltage detector circuit according to claim 1, further comprising a first switch, which is controlled by the control circuit, between the flying capacitor and the voltage detecting unit.

* * * * *